(12) United States Patent
Higashiguchi

(10) Patent No.: US 6,316,735 B1
(45) Date of Patent: Nov. 13, 2001

(54) SEMICONDUCTOR CHIP MOUNTING BOARD AND A SEMICONDUCTOR DEVICE USING SAME BOARD

(75) Inventor: Masahiro Higashiguchi, Kohbe (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 08/966,443

(22) Filed: Nov. 7, 1997

(30) Foreign Application Priority Data

Nov. 8, 1996 (JP) .................................................. 8-296465

(51) Int. Cl.⁷ .................................................. H01R 23/72
(52) U.S. Cl. .................... 174/260; 228/180.21; 257/779; 257/781; 257/693; 361/772; 361/773
(58) Field of Search ............................ 174/260; 361/760, 361/767, 768, 772, 773, 774, 777, 808, 751; 257/778, 779, 781, 678, 690, 692, 693, 694; 228/180.21, 180.22; 438/106

(56) References Cited

U.S. PATENT DOCUMENTS 5,381,307    1/1995  Hertz et al. .......................... 361/767
5,760,469 *  6/1998  Higashiguchi et al. ............... 257/678

FOREIGN PATENT DOCUMENTS

| 5853837    | 3/1983  | (JP) . |
| 61224444   | 10/1986 | (JP) . |
| 62-150837 *| 7/1987  | (JP) . |
| 1 73733    | 3/1989  | (JP) . |
| 1302824    | 12/1989 | (JP) . |
| 4-314355 * | 11/1992 | (JP) . |
| 8-46313 *  | 2/1996  | (JP) . |

* cited by examiner

*Primary Examiner*—Albert W. Paladini
(74) *Attorney, Agent, or Firm*—Cooper & Dunham LLP

(57) ABSTRACT

A semiconductor chip mounting board which improves reliability of electrical connection between a semiconductor chip mounted thereupon and a wiring pattern on a printed circuit board on which the semiconductor chip mounting board is mounted at low cost and in an easy manner. The semiconductor chip mounting board mounts a semiconductor chip on one surface of the board and forms a connecting pad electrically connecting with a wiring pattern of a printed circuit board on the other surface of the board. The semiconductor chip mounting board further forms on the other surface of the board a connection reinforcing pad, which is thicker than the connecting pad electrically connecting with the wiring pattern on the printed circuit board.

5 Claims, 6 Drawing Sheets

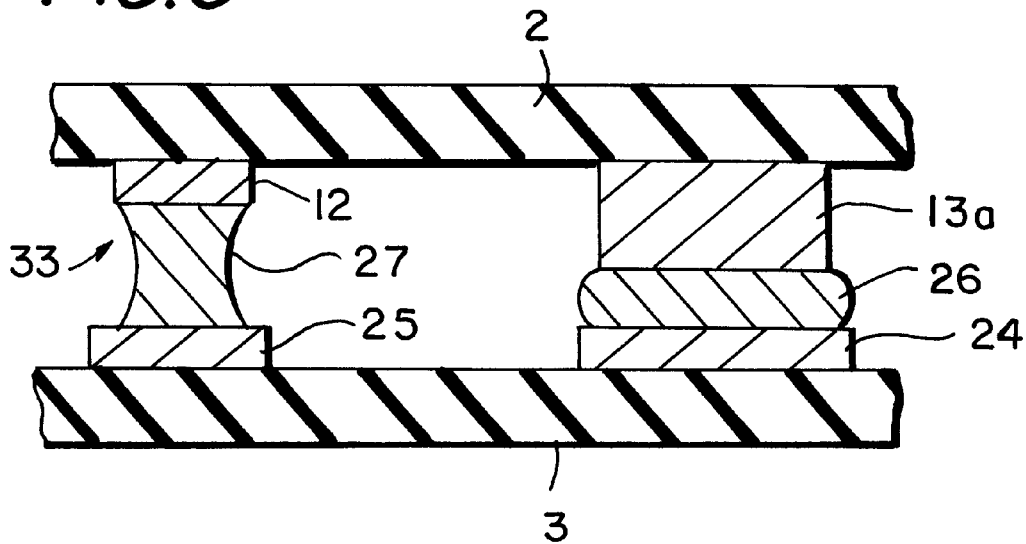
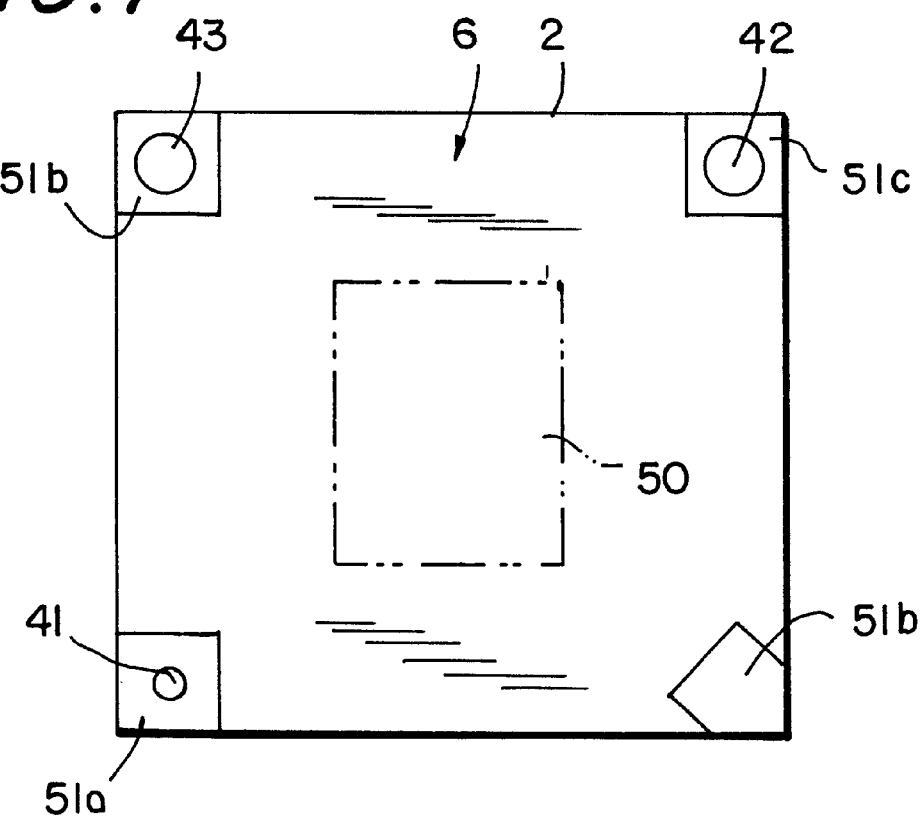

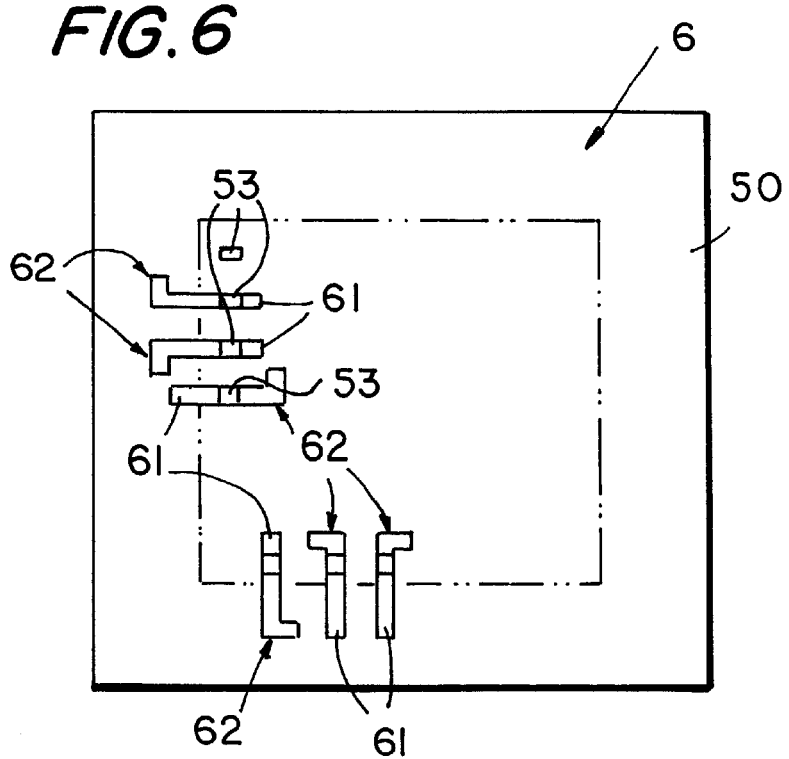
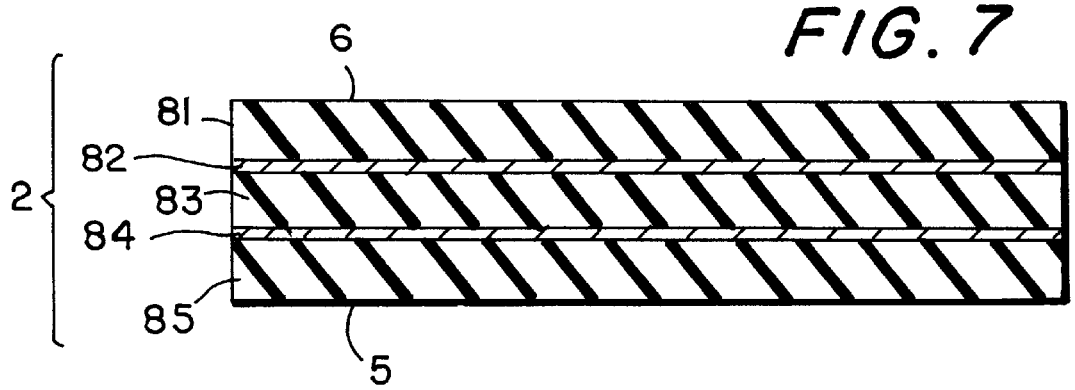

SEMICONDUCTOR CHIP MOUNTING BOARD AND A SEMICONDUCTOR DEVICE USING SAME BOARD

BACKGROUND OF THE INVENTION

1. Field of the invention

The present invention relates to a semiconductor chip mounting board for mounting a semiconductor chip thereupon and for electrically connecting the semiconductor chip with a wiring pattern on a printed circuit board, and further relates to a semiconductor device using the same semiconductor chip mounting board. The present invention more particularly relates to a semiconductor chip mounting board which increases reliability of electrical connection between a semiconductor chip mounted thereupon and a wiring pattern on a printed circuit board.

2. Discussion of the Background

FIG. 9 is a perspective drawing schematically illustrating a positional relationship between a semiconductor chip, a semiconductor chip mounting board and a printed circuit board (hereinafter referred to as a PCB) in a related semiconductor device. After a semiconductor chip 101 is formed from a wafer through a process of dicing the wafer, the semiconductor chip 101 is mounted on a semiconductor chip mounting surface 106 of a semiconductor chip mounting board 102 in a predetermined position. Generally, a solder bump is formed on each electrode pad of the semiconductor chip 101, and the solder bump is bonded with a corresponding lead wire formed on the semiconductor chip mounting surface 106 for electrical connection with the semiconductor chip 101. The semiconductor chip mounting surface 106 on which the semiconductor chip 101 is mounted is then covered by a mold resin (not shown).

The semiconductor chip mounting board 102 includes a PCB facing surface 105 at the opposite side of the board from the semiconductor chip mounting surface 106. The PCB facing surface 105 includes connecting pads, each of which is connected with the corresponding lead wire on the semiconductor chip mounting surface 106 via a through-hole. The semiconductor chip 101 and wiring patterns on a printed circuit board (PCB) 103 are electrically connected by bonding each of the solder bumps formed on the connecting pads of the PCB facing surface 105 of the semiconductor chip mounting board 102 with the corresponding wiring pattern on the PCB 103.

When the PCB 103 and the semiconductor chip mounting board 102 are connected via solder bumps as described above, they are heated and then cooled, and the change in the temperature causes distortion or bending in the PCB 103. Such distortion or bending in the PCB 103 causes cracking in the solder bumps between the connecting pads of the semiconductor chip mounting board 102 and the wiring patterns on the PCB 103. Cracking in the solder bumps causes a break in electrical connection between the connecting pads of the semiconductor chip mounting board 102 and the wiring patterns on the PCB 103, and as a result, a break in electrical connection between the semiconductor chip 101 and the wiring patterns on the PCB 103 occurs.

For solving the aforementioned problem, a related technology in Japanese Laid-open Patent Publication No. 58-53837 proposes providing a semiconductor chip mounting board with connection reinforcing pads to which an electric current is not applied to. Such a connection reinforcing pad is provided at each corner of a semiconductor chip mounting board because, when distortion or bending is formed in a printed circuit board on which the semiconductor chip mounting board is mounted, a solder bump formed on a connecting pad at each corner of the semiconductor chip mounting board is generally most significantly affected by the distortion or bending of the printed circuit board, causing cracking in the solder bump.

In a related technology shown in Japanese Laid-open Patent Publication No. 61-224444, an electrode lead is formed on each connecting pad of a semiconductor chip, each extending 0.5 mm therefrom. The electrode lead is inserted in a solder hole provided in an electrode pad of a semiconductor chip mounting board and is then soldered therein. With this construction, even when a cracking force is applied to the solder bump, the force is neutralized by the electrode lead and a crack in the solder bump is prevented. In this publication, the technology is applied to enforcing connection between a semiconductor chip and a semiconductor chip mounting board, but the same technology can be applied to enforcing connection between a semiconductor chip mounting board and a printed circuit board.

In a related technology shown in U.S. Pat. No. 5,381,307, a connecting pad having a contact surface larger than a contact surface of other connecting pads is provided at each corner of a semiconductor chip mounting board. These connecting pads, each having a larger contact surface, are provided for the purpose of compensating a positional deviation between a connecting pad of the semiconductor chip mounting board and a corresponding wiring pattern on a printed circuit board through an effect of a surface tension of the solder bump formed on each of these connecting pads. In other words, the contact surface of the connecting pad at each corner of the semiconductor chip mounting board is not made larger for preventing a cracking in the solder bump formed on each of the connecting pads and connecting with the corresponding wiring pattern on the printed circuit board. Nevertheless, the solder bump on the connecting pad at each corner of the semiconductor mounting board is reinforced as a result of increasing the contact surface of the connecting pad.

In each of the technologies respectively shown in Japanese Laid-open Patent Publication No. 58-53837 and U.S. Pat. No. 5,381,307, the solder bump formed on the connecting pad at each corner of the semiconductor chip mounting board is reinforced as described above. However, solder bumps formed on other connecting pads, each of which is electrically connecting with a corresponding wiring pattern on a printed circuit board, are not reinforced to a level not to be cracked by a cracking force caused by distortion or bending in the printed circuit board.

The technology shown in Japanese Laid-open Patent Publication No. 61-224444, if applied to the connection between a semiconductor chip mounting board and a PCB, would require the provision of an electrode lead to an electrode pad of a semiconductor chip mounting board and a solder hole in the corresponding electrode pad on a printed circuit board, which would require an additional manufacturing process. This increases the manufacturing cost of the semiconductor chip mounting board and the semiconductor device using that board.

When the semiconductor chip 101 is mounted on the semiconductor chip mounting surface 106 of the semiconductor chip mounting board 102, the direction and the position of the semiconductor chip mounting board 102 need to be determined for placing the semiconductor chip 101 in a correct direction and position on the semiconductor chip mounting board 102. Generally, the direction and the position of the semiconductor chip mounting board 102 are determined based upon the result of recognizing the position of a recognition pattern formed on the semiconductor chip mounting surface 106. The semiconductor chip 102 is then mounted accordingly in a predetermined direction and position on the semiconductor chip mounting surface 106. The above-described technology is shown in Japanese Laid-open Patent Publications No. 1-302824 and No. 64-73733.

When the semiconductor chip mounting board 102 is mounted on the PCB 103, the direction and the position of the semiconductor chip mounting board 102 need to be determined again for correctly placing the semiconductor chip mounting board 102 in a predetermined direction and position on the PCB 103. Further, after the semiconductor chip mounting board 102 is mounted on the PCB 103, when the mounting condition is inspected, the direction and the position of the semiconductor chip mounting board 102 on the PCB 103 need to be recognized for performing the inspection in a precise manner.

However, a package is generally provided to cover the semiconductor chip mounting surface 106 after the semiconductor chip 102 is mounted on the semiconductor chip mounting surface 106, and if the package is provided covering the recognition pattern on the semiconductor chip mounting surface 106, it becomes impossible to determine the direction and the position of the semiconductor chip mounting board 102.

A semiconductor chip to which a high frequency signal is applied is also generally mounted on a semiconductor chip mounting board and then connected with a wiring pattern formed on a PCB in the same manner as described above. A high frequency signal tends to be mixed with noise, making the signal level unstable. Therefore, when a semiconductor chip to which a high frequency signal is applied is mounted on a semiconductor chip mounting board, a capacitor is generally provided on the PCB beside the semiconductor chip mounting board to eliminate noise from the high frequency signal. This causes a problem in that the volume of the PCB, and consequently the volume of the overall circuit of a semiconductor device using that PCB, are thereby increased.

SUMMARY OF THE INVENTION

The present invention has been made in view of such problems and to address and solve these problems.

Accordingly, an object of the present invention is to provide a semiconductor chip mounting board which, at low cost and in an easy manner, increases the reliability of electrical connection between a semiconductor chip mounted thereupon and a wiring pattern of a printed circuit board on which the semiconductor chip mounting board is mounted.

Another object of the present invention is to provide a semiconductor chip mounting board whose direction and position can be easily recognized.

A further object of the present invention is to provide a semiconductor chip mounting board which decreases the volume of a printed circuit board on which the semiconductor chip mounting board is mounted and a semiconductor device using that semiconductor chip mounting board.

In order to achieve the above and other objects, a semiconductor chip mounting board of the present invention mounts a semiconductor chip on one surface of the board and forms a connecting pad or pads electrically connecting with a wiring pattern of a printed circuit board on the other surface of the board. The semiconductor chip mounting board further forms a connection reinforcing pad or pads, which is or are thicker than the connecting pad, on the other surface of the board.

The other surface of the semiconductor chip mounting board may be rectangular and the connection reinforcing pads may be provided at least in two diagonally positioned corners of the other surface of the semiconductor chip mounting board.

Further, a surface of the (or each) connection reinforcing pad, contacting a printed circuit board, may be made larger than a surface of the connecting pad, contacting a wiring pattern of the printed circuit board.

In order to achieve the above and other objects, in a semiconductor chip mounting board of this invention, a surface of the board mounting a semiconductor chip thereupon is larger than an area for mounting the semiconductor chip therein, and a recognition pattern for recognizing the direction and the position of the semiconductor chip mounting board is formed on the surface of the board outside the semiconductor chip mounting area.

When a plurality of recognition patterns are formed, one of the plurality of recognition patterns may be made different in form from the other recognition patterns.

Further, in order to achieve the above and other objects, a semiconductor chip mounting board for mounting a semiconductor chip having an electrode pad is provided with, according to the present invention, a lead wire, which is longer than the width of an electrode pad of the semiconductor chip, on the surface of the board mounting a semiconductor chip thereupon. The lead wire is arranged in a position where the corresponding electrode pad of the semiconductor chip is disposed.

At least one end of the lead wire in a longitudinal direction may extend a predetermined length from the electrode pad position.

Furthermore, a semiconductor chip mounting board of the present invention forms a lead wire electrically connecting with a semiconductor chip on a surface of the board mounting a semiconductor chip thereupon and a connecting pad electrically connecting with a wiring pattern of a printed circuit board on the other surface of the board. The semiconductor chip mounting board includes, between the surface on which the lead wire is formed and the other surface on which the connecting pad is formed, a first conductive layer connecting with at least one of (i) the lead wire to which an electric voltage to be supplied to the semiconductor chip is applied and (ii) the connecting pad, and a second conductive layer connecting with at least one of (i) the lead wire for grounding and (ii) the connecting pad. The second conductive layer is arranged so as to face the first conductive layer with a dielectric layer being interposed between them.

Still further, a semiconductor device of this invention is provided with a semiconductor chip mounting board whose surface for mounting a semiconductor chip thereupon is larger than an area for mounting a semiconductor chip therein. An area is prescribed in a part of the surface of the board other than the semiconductor mounting area and a package is provided to cover the whole area of the surface of the board except the prescribed area.

When a plurality of areas are prescribed, one of the areas may be made different in form from the other areas.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 3 is a sectional view schematically showing a state in which the semiconductor chip mounting board is mounted on a PCB in a predetermined position;

FIG. 4 is a plan view showing a semiconductor mounting surface of the semiconductor chip mounting board, on which the semiconductor chip is mounted;

FIG. 6 is a drawing showing a wiring pattern on the semiconductor mounting surface, which is to be connected with a solder bump formed on each electrode pad of the semiconductor chip;

FIG. 7 is a sectional view schematically showing a thickness-wise construction of the semiconductor chip mounting board of the invention;

DESCRIPTION OF THE PREFERRED EMBODIMENTS

Figure 1:
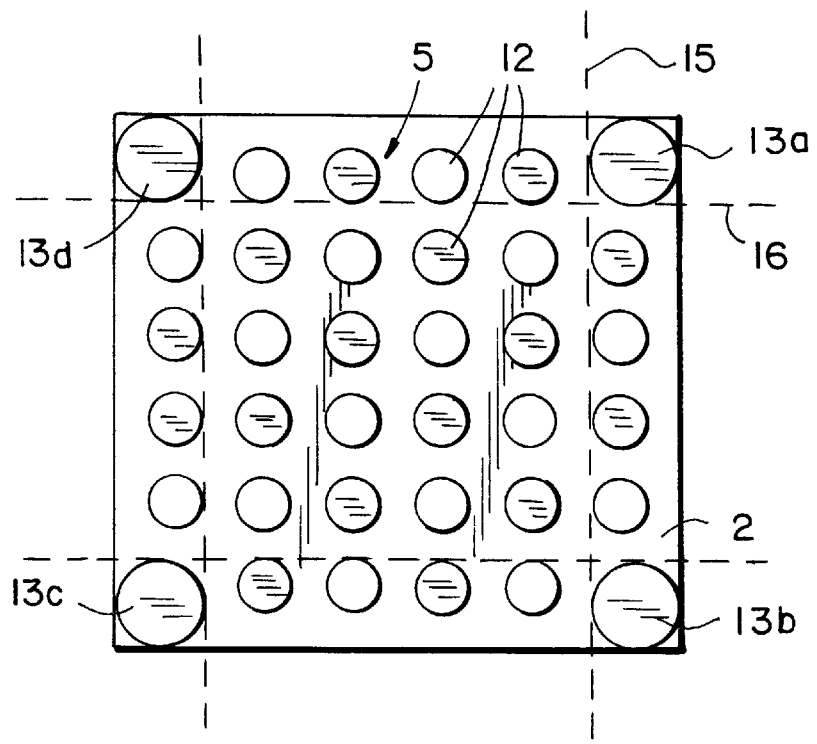
FIG. 1 is a plan view showing a PCB facing surface of a semiconductor chip mounting board of the present invention.

Referring now to the drawings, wherein like reference numerals designate identical or corresponding parts throughout the several views, embodiments of the present invention are explained herein below.

A semiconductor chip mounting board according to the present invention is constructed with a rectangular and flat board and a semiconductor chip is mounted on a surface of the board. After a semiconductor chip is mounted on the board, the semiconductor chip mounting board is mounted on a printed circuit board (PCB) with the surface of the board, opposite to the surface on which the semiconductor chip is mounted, facing the PCB. The surface of the semiconductor chip mounting board on which a semiconductor chip is mounted is hereinafter called a semiconductor chip mounting surface, and the surface opposite to the semiconductor chip mounting surface is hereinafter called a PCB facing surface.

First, a PCB facing surface of the semiconductor chip mounting board is explained.

Figure 2:
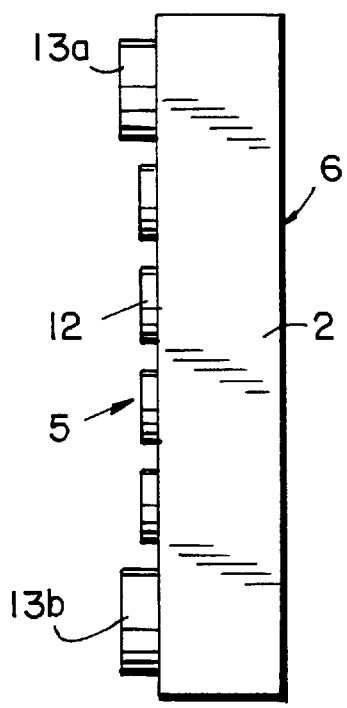
FIG. 2 is a side view of the semiconductor chip mounting board shown in FIG. 1.

FIG. 1 is a plan view illustrating a PCB facing surface 5 of a semiconductor chip mounting board 2, and FIG. 2 is a side view of the semiconductor chip mounting board 2 shown in FIG. 1.

The semiconductor chip mounting board 2 includes a plurality of connecting pads 12 and four connection reinforcing pads 13a–13d on the PCB facing surface 5. Each of the connecting pads 12 is constituted of a solder bump having a diameter of 0.5 mm and a thickness of 30–40 $\mu$m.

The number of connecting pads 12 corresponds to the number of electrodes or electrode pads of a semiconductor chip to be mounted on the semiconductor chip mounting board 2. The connecting pads 12 include a connecting pad 12 to which a voltage is applied from an electric source and a connecting pad 12 for grounding. Each of the connection reinforcing pads 13a–13d is constituted of a solder bump having a diameter larger than that of the connecting pads 12, such as, for example, a diameter of 0.6–1.0 mm in this embodiment. Further, the connection reinforcing pads 13a–13d are made thicker than the connecting pads 12 by a predetermined thickness, such as for example, 10 $\mu$m, to have a thickness of 40–50 $\mu$m in this embodiment. It will be understood that the thickness of a pad is the dimension of the pad that is perpendicular to the plane of the surface 5.

The connecting pads 12 and the connection reinforcing pads 13a–13d are arranged in a matrix form, for example, in rows of six, vertically and horizontally, as shown in FIG. 1. Each of the connection reinforcing pads 13a–13d is arranged in a corner of the matrix. The connection reinforcing pads 13a and 13b are respectively arranged at an end position of a vertical row of the matrix at the extreme right side end (in the drawing) of the semiconductor chip mounting board 2. Further, the connection reinforcing pads 13a and 13b are arranged so as to contact a common tangent line 15 of the left sides (in the drawing) of the four connecting pads 12 which are arranged between the connection reinforcing pads 13a and 13b. The connection reinforcing pads 13a and 13d are respectively arranged at an end position of a horizontal row of the matrix at the upper end (in the drawing) of the semiconductor chip mounting board 2 and contact a common tangent line 16 of the bottom sides of the four connecting pads 12 which are arranged between the connection reinforcing pads 13a and 13d. Thus, the connection reinforcing pad 13a is arranged so that the center of the connection reinforcing pad 13a is more biased to the outside of the board than the center of each connecting pad 12 in the same row. The other connection reinforcing pads 13b, 13c and 13d are arranged in the same manner and therefore explanation is omitted.

FIG. 3 is a sectional view schematically illustrating the semiconductor chip mounting board 2 and the PCB 3 in a state that the semiconductor chip mounting board 2 is mounted on the PCB 3 in a predetermined position. The connection reinforcing pad 13a of the semiconductor chip mounting board 2 is connected with a pad 24 formed on the PCB 3 via a solder bump. Each connecting pad 12 is connected with a corresponding wiring pattern 25 formed on the PCB 3 via a solder bump. Each of the connection reinforcing pads 13b, 13c and 13d is also connected with a corresponding pad 24 in the same manner, and therefore explanation is omitted.

Each of the connection reinforcing pads 13a–13d is thicker than the connecting pads 12 as described above. The pad 24 and the wiring pattern 25, both on the PCB 3, are substantially the same in thickness. Accordingly, when the connection reinforcing pad 13a and the corresponding pad 24 are connected, a relatively large space is formed between each of the connecting pads 12 and the corresponding wiring pattern 25. For example, a space of about 10 $\mu$m is formed in this embodiment.

If the connection pad 12 and the corresponding wiring pattern 25 are connected via a solder bump when a relatively large space exists between them as described above, a solder bump 27 is formed in a shape of a hand drum having a dent in a middle part 33 thereof as shown in FIG. 3. The solder bump 27 in a hand drum shape having a dent in the middle absorbs a force to distort the soldering part more than a solder bump having a convex in the middle does. Such a solder bump having a convex in the middle is formed when a space between the connecting pad 12 and the corresponding wiring pattern 25 is relatively narrow. In another words, reliability of connection between the connecting pad 12 and the corresponding wiring pattern 25 via a solder bump is higher when a relatively large space exists between the connecting pad 12 and the corresponding wiring pattern 25 and the solder bump is formed in a hand drum shape having a dent in the middle than when a relatively narrow space exists and the solder bump is formed to have a convex in the middle. The advantage of such a drum shape having a dent is described in pages 43–44 and pages 144–146 of a publication titled "A method of mounting a bare chip" published by Kabushikikaisha Gijyutsu Jyoho Kyokai, Tokyo, Japan.

By thus forming a relatively large space between each connecting pad 12 and the corresponding wiring pattern 25 and thereby forming the solder bump 27 in a shape of a hand drum having a dent in the middle, even if the PCB 3 is bent due to a temperature change after the semiconductor chip mounting board 2 is mounted on the PCB 3 and a cracking force is applied to the solder bump 27, cracking in the solder bump 27 is prevented and thus a break in electrical connection between the connecting pad 12 and the corresponding wiring pattern 25 is avoided.

Further, because the contact surface of each of the connection reinforcing pads 13a–13d and the corresponding pad 24 is larger than the contact surface of the connecting pad 12 and the corresponding wiring pattern 25, even if each of the connecting pads 12 and the corresponding wiring pattern 25 are not correctly positioned to face each other when the semiconductor chip mounting board 2 is mounted on the PCB 3, each of the connection reinforcing pads 13a–13d and the corresponding pad 24 can be positioned partly facing each other. Then, when the connection reinforcing pads 13a–13d are respectively soldered with the pad 24, the semiconductor chip mounting board 2 moves to the correct position by work of the surface tension of the liquefied solder bumps 26, and as a result, each of the connecting pads 12 comes to the position to face the corresponding wiring pattern 25. Further, even when the above described movement of the semiconductor chip mounting board 2 by work of the surface tension of the liquefied solder bumps 26 is not sufficient enough to move the semiconductor chip mounting board 2 precisely to the correct position, the semiconductor chip mounting board 2 moves to the correct position by work of the surface tension of the liquefied solder bumps 27 at a time when each connecting pad 12 is soldered with the corresponding wiring pattern 25.

Thus, even when the mounting position of the semiconductor chip mounting board 2 on the PCB 3 is deviated from the correct position when the semiconductor chip mounting board 2 is mounted on the PCB 3, the semiconductor chip mounting board 2 automatically moves to the correct position on the PCB 3 as described above, and consequently the board 2 is mounted in the correct position.

Further, because the connection reinforcing pads 13a–13d, each having a large contact surface, are respectively provided at four corners of the semiconductor chip mounting board 2, which are most significantly affected by bending or distortion of the PCB 3, the contact conditions between the semiconductor chip mounting board 2 and the PCB 3 are kept relatively stable even when the PCB 3 is bent due to a temperature change after the semiconductor chip mounting board 2 is mounted on the PCB 3 Thus, reliability of electrical connection between the connecting pads 12 of the semiconductor chip mounting board 2 and the wiring pattern on the PCB 3 is further increased.

In the above embodiment, a connection reinforcing pad is provided in each corner of the semiconductor chip mounting board 2. However, the same effect may be obtained by providing a connection reinforcing pad, having a contact surface larger than that of the connection reinforcing pad in the above embodiment, only in two diagonally positioned corners of the semiconductor chip mounting board 2.

FIG. 4 is a plan view of the semiconductor chip mounting surface 6 of the semiconductor chip mounting board 2, on which a semiconductor chip is mounted.

The semiconductor chip mounting surface 6 is larger than a semiconductor chip which is to be mounted thereupon. The semiconductor chip mounting surface 6 includes package prohibiting areas 51a–51d, in each of which a wiring pattern is not formed, each being arranged in a corner of the semiconductor chip mounting surface 6. The semiconductor chip mounting surface 6 further includes a semiconductor chip mounting area 50 for mounting a semiconductor chip therein in the center of the mounting surface 6.

Each of the package prohibiting areas 51a–51c is formed, for example, in a square having a side of 1 mm in length. A recognition pattern 41 for recognizing the direction and the position of the semiconductor chip mounting board 2 (for mounting the chip on the mounting board) is formed in the package prohibiting area 51a. The recognition pattern 41 is formed, for example, in a circle having a diameter of 0.2–0.3 mm. The package prohibiting area 51c, which is located in the corner opposite to the package prohibiting area 51a, includes a recognition pattern 42, which is formed in a circle having a larger circle than the circle of the recognition pattern 41, such as, for example, a circle having a diameter of 0.4–0.5 mm. The package prohibiting area 51b includes a recognition pattern 43 which is formed, for example, in the same form as the recognition pattern 42. Each of the recognition patterns 41–43 may be formed in any shape other than those described above.

The package prohibiting area 51d is formed in a shape different from the package prohibiting areas 51a–51c, for example, in a pentagon as shown in FIG. 4. Further, although the drawing does not show a recognition pattern in this area 51d, a recognition pattern may be formed.

Figure 5A:
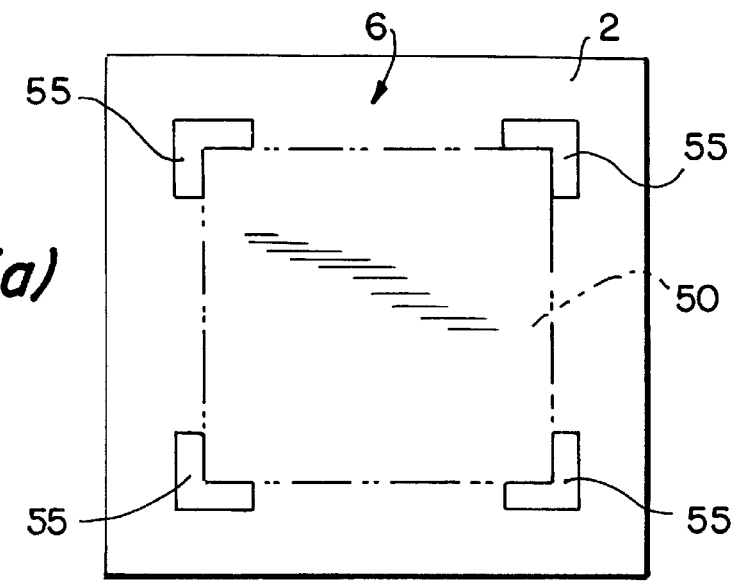
FIGS. 5(a)–5(c) are drawings showing examples of an accuracy detect pattern which is formed on the semiconductor mounting surface of the semiconductor chip mounting board for detecting accuracy of the position of the semiconductor chip mounted in a chip mounting area on the board.
Figure 5B:
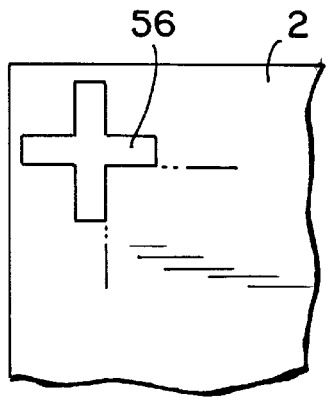
Figure 5C:
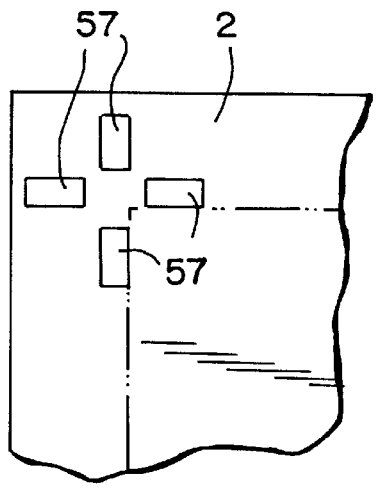

FIGS. 5(a)–5(C) illustrate various examples of an accuracy detect pattern for detecting the accuracy of the position of a semiconductor chip which is mounted in the chip mounting area 50. Each of the patterns is formed outside of the chip mounting area 50 and along each of the four corners of the chip mounting area 50. FIG. 5(a) shows an accuracy detect pattern 55 formed in a L-shaped form. FIG. 5(b) shows an accuracy detect pattern 56 formed in a cross form, and FIG. 5(c) shows an accuracy detect pattern 57 formed in a cross form having no center portion.

FIG. 6 illustrates wiring patterns on the semiconductor chip mounting surface 6. Each of the wiring patterns is connected with a corresponding electrode pad of a semiconductor chip via a solder bump. In addition to the accuracy detect pattern (e.g., 55, 56 and 57 described above), the portion of the semiconductor chip mounting surface 6 near the chip mounting area 50 has formed therein a plurality of lead wires 61 equal in number to the electrode pads of the semiconductor chip. The plurality of lead wires 61 includes a lead wire 61 to which a voltage is applied from the electric source and a lead wire 61 for grounding.

Each of the lead wires 61 is formed with a conductive element having a width of 0.1 mm and a length of 0.5 mm.

A through-hole 62 is formed at one longitudinal end of each of the lead wires 61 for connection with the corresponding electrode pad 12 formed on the PCB facing surface of the semiconductor chip mounting board 2. Each of the lead wires 61 is arranged so that the extension line from an end of the lead wire 61 in the longitudinal direction is at a right angle to an edge of the semiconductor chip mounting board 2. Each of the lead wires 61 is further arranged so that one end of the lead wire 61 is positioned 0.2–0.3 mm outside or inside of a virtual electrode position 53 representing a position of a solder bump formed on each electrode pad of the semiconductor chip at a time when the semiconductor chip is correctly placed in the chip mounting area 50. The diameter of the last-mentioned solder bump is, for example, 0.1 mm.

Next, a process of mounting a semiconductor chip on the semiconductor chip mounting surface 6 of the semiconductor chip mounting board 2 and a process of mounting the semiconductor chip mounting board 2 on a PCB are explained.

Before a semiconductor chip is mounted in the chip mounting area 50 of the semiconductor chip mounting board 2, the direction and the position of the semiconductor chip mounting board 2 are determined by recognizing the position of each of the recognition pattern 41 and the recognition pattern 42 on the semiconductor chip mounting surface 6.

Once the direction and the position of the semiconductor chip mounting board 2 are determined, the semiconductor chip is mounted on the chip mounting area 50 in accordance with the determined direction and position of the semiconductor chip mounting board 2. After the semiconductor chip is mounted on the chip mounting area 50, positional accuracy of the semiconductor chip on the chip mounting area 50 is determined based upon measurement of a distance between each corner of the semiconductor chip and the corresponding corner of the accuracy detect pattern provided along and outside each corner of the chip mounting area 50. When it is determined that the semiconductor chip is not accurately mounted in the chip mounting area 50, the mounting position is corrected based upon the result of the above measurement. Then, a solder bump formed on each electrode pad of the semiconductor chip is bonded with the corresponding lead wire 61.

Even when the mounting position of the semiconductor chip is corrected as described above, the position of the solder bump formed on each electrode pad of the semiconductor chip may deviate from the corresponding virtual electrode pad position 53 due to, for example, an error in the above described measurement.

However, even if such deviation occurs, each solder bump can be connected with the corresponding lead wire 61, because each of the lead wires 61 is arranged so as to extend 0.2–0.3 mm towards the inside or the outside of the chip mounting area 50 from the corresponding virtual electrode pad position 53 as described above.

After each of the electrode pads of the semiconductor chip is connected with the corresponding lead wire 61 via a solder bump, the semiconductor mounting surface 6 is packaged by a resin mold except at the package prohibiting areas 51a–51d.

After the semiconductor mounting surface 6 is packaged, when the semiconductor chip mounting board 2 is mounted on a PCB, the direction and the position of the semiconductor chip mounting board 2 are determined by recognizing the position of the package prohibiting area 51d which is different in form from the other package prohibiting areas 51a–51c. The semiconductor chip mounting board 2 is then mounted on the PCB in a prescribed direction and position in accordance with the determined direction and position of the semiconductor chip mounting board 2. Thus, the semiconductor chip mounting board 2 can be mounted on the PCB correctly in the prescribed direction and position.

Further, after the semiconductor chip mounting board 2 is mounted on the PCB, when the mounting condition of the semiconductor chip mounting board 2 is inspected, the direction and the position of the semiconductor chip mounting board 2 on the PCB can be easily determined by recognizing the position of the package prohibiting area 51d, and consequently, the inspection can be made in a precise manner.

The direction and the position of the semiconductor chip mounting board 2 can be determined also by recognizing the recognition pattern 41 of the package prohibiting area 51a and the recognition pattern 42 of the package prohibiting area 51c which are not covered by the resin mold.

In the above embodiment, the shape of the package prohibiting areas 51a–51c is made different from that of the package prohibiting area 51d. However, when each of the recognition patterns is so made that the direction and the position of the semiconductor chip mounting board 2 are determined based upon the result of recognizing the recognition patterns only, then each of the package prohibiting areas 51a–51c and the package prohibiting area 51d may be formed in the same shape.

Further, although the package prohibiting area is formed in each corner of the semiconductor chip mounting surface 6 in the above embodiment, the package prohibiting area does not need to be formed in each corner of the chip mounting surface 6. For example, the package prohibiting area may be formed only in one of the four corners of the semiconductor chip mounting surface 6.

FIG. 7 is a sectional view of the semiconductor chip mounting board 2 schematically illustrating a thickness-wise construction of the board 2. In the drawing, the semiconductor chip mounting surface 6 is formed on the top surface and the PCB facing surface 5 on the bottom surface of the board 2. The semiconductor chip mounting board 2 includes a first insulating layer 81 whose one surface functions as the semiconductor chip mounting surface 6, and a second insulating layer 85 whose one surface functions as the PCB facing surface 5. The insulating layers 81 and 85 are both made of, for example, an alumina plate having a thickness of 0.1 mm. The semiconductor chip mounting board 2 further includes a first conductive layer 82, a dielectric layer 83 and a second conductive layer 84, which are formed between the first insulating layer 81 and the second insulating layer 85.

The first conductive layer 82 is formed on the surface of the first insulating layer 81, opposite to the surface functioning as the semiconductor chip mounting surface 6, and includes a wiring pattern to which a voltage is applied from the electric source. Namely, the wiring pattern is connected with at least one of (i) the lead wire 61 and (ii) the connecting pad 12 to which a voltage is applied from the electric source, through a through-hole or by extending the wiring pattern.

The second conductive layer 84 is formed on the surface of the second insulating layer 85, opposite to the surface functioning as the PCB facing surface 5, and includes a wiring pattern for grounding. The wiring pattern is connected with at least one of (i) the lead wire 61 and (ii) the connecting pad 12 for grounding through a through-hole or by extending the wiring pattern.

The first conductive layer 82 and the second conductive layer 84 face each other and hold between them the dielectric layer 83 which is made of barium titanate or the like, forming the semiconductor chip mounting board 2 as shown in FIG. 7.

Thus, the semiconductor chip mounting board 2 forms, inside the board, a capacitor which is constructed with the first conductive layer 82, the second conductive layer 84 and the dielectric layer 83. The capacity of this capacitor is determined by the shape and thickness of the wiring patterns respectively constituting the first conductive layer 82 and the second conductive layer 84 and the material and thickness of the dielectric layer 83.

Each of the first conductive layer 82 and the second conductive layer 84 may be formed inside the semiconductor chip mounting board 2 independently from the respective wiring patterns.

Figure 8:
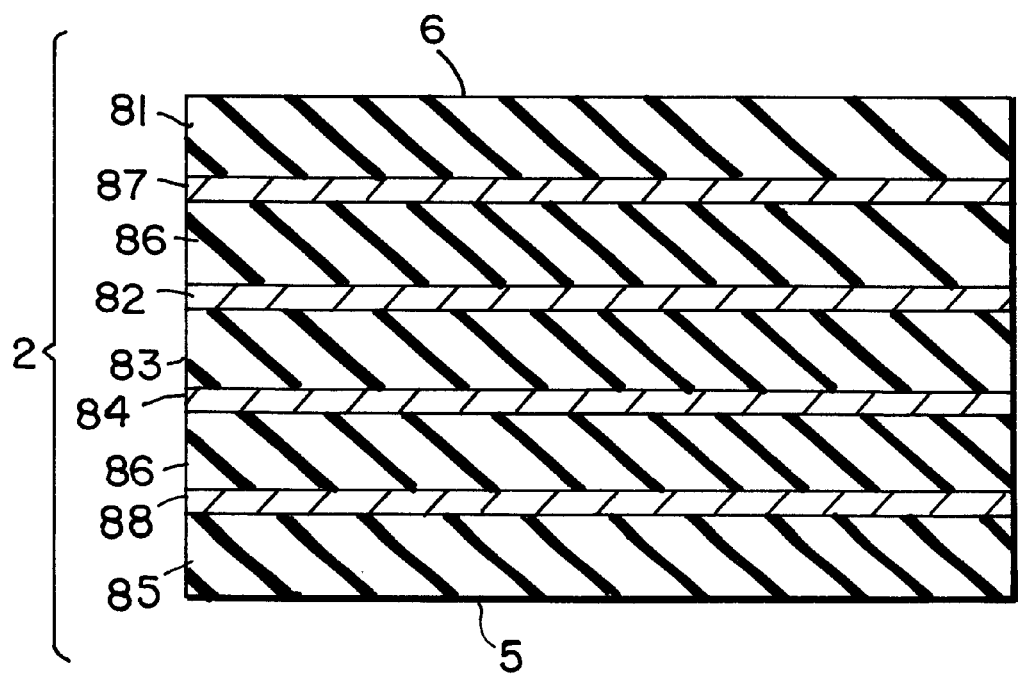
FIG. 8 is a sectional view schematically showing an alternative thickness-wise construction of the semiconductor chip mounting board.
Figure 9:
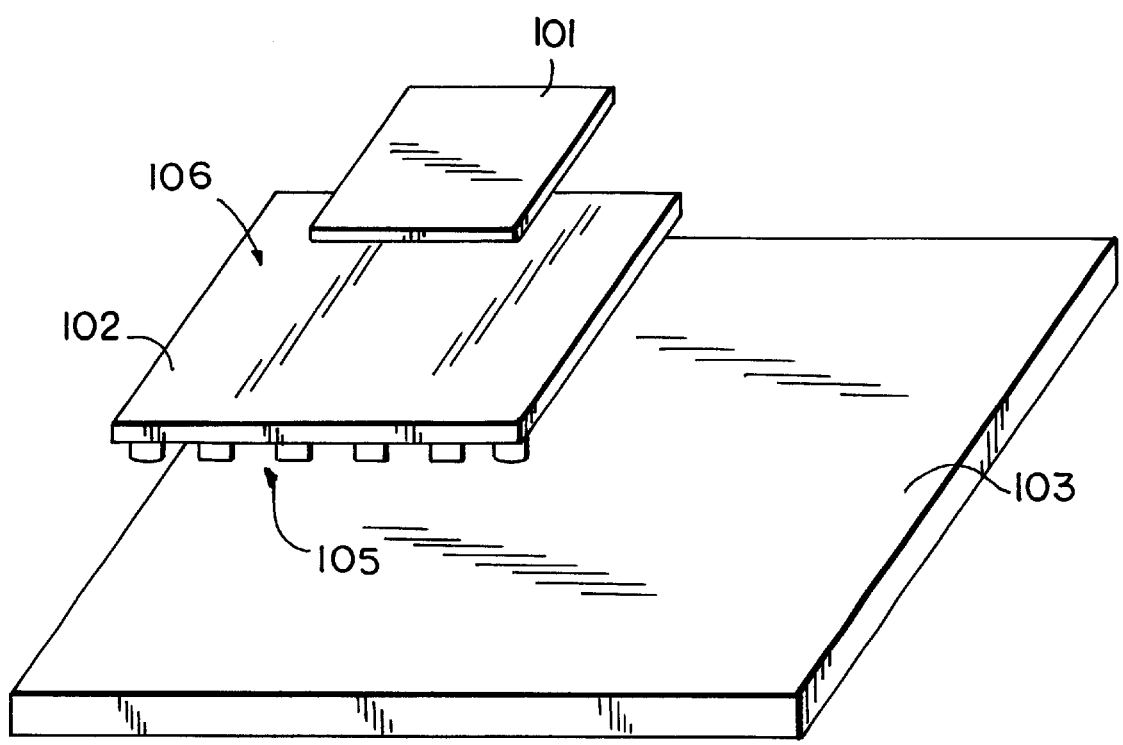
FIG. 9 is a perspective view showing a positional relationship between a semiconductor chip mounting board, a semiconductor chip and a printed wiring board in a semiconductor device of the general type to which the present invention relates.

FIG. 8 shows an example of such an alternative construction of the semiconductor chip mounting board. In the drawing, a wiring pattern 87, to which a voltage is applied from the electric source, is disposed underneath the first insulating layer 81, and the first conductive layer 82, made of, for example, a metal layer, is disposed underneath the wiring pattern 87, with an insulating film 86 interposed therebetween. Further, a wiring pattern 88 for grounding is disposed upon the second insulating layer 85, and the second conductive layer 84, made of, for example, a metal layer, is disposed upon the wiring pattern 88, with the insulating film 86 interposed therebetween. The dielectric layer 83 is interposed between the first conductive layer 82 and the second conductive layer 84.

The first conductive layer 82 is connected with the wiring pattern 87, for example, via a through hole (not shown) formed in the insulating film 86. The second conductive layer 84 is connected with the wiring pattern 88, for example, via a through hole (not shown) formed in the insulating film 86.

The positions of the first conductive layer 82 and the second conductive layer 84 may be interchanged.

Further, the first conductive layer 82 and the second conductive layer 84 may be respectively arranged in any position inside the board as long as the first conductive layer 82 and the second conductive layer 84 face each other and the dielectric layer 83 is disposed between these conductive layers 82 and 84.

As described earlier, when a semiconductor chip to which a high frequency signal is applied is mounted on a semiconductor chip mounting board, a capacitor is generally provided on a PCB beside the semiconductor chip mounting board to eliminate the noise from a high frequency signal to be supplied to the semiconductor chip. This causes a problem of increased volume of the PCB and consequently of the overall circuit of the semiconductor device.

However, with the semiconductor chip mounting board as constructed above, noise which is mixed with a high frequency signal can be removed from the signal by the above-described capacitor formed inside the board, and a high frequency signal with a stable voltage can be supplied to the semiconductor chip. Thus, it is not necessary to dispose a capacitor outside the semiconductor chip mounting board on a PCB as in conventional arts, and the overall volume of the circuit of the semiconductor device can be minimized. Further, the capacitor can be easily formed, because signal lines in the semiconductor chip mounting board 2 are used.

Numerous additional modifications and variations of the present invention are possible in light of the above teachings. It is therefore to be understood that within the scope of the appended claims, the present invention may be practiced otherwise than as specifically described herein.

This application is based upon Japanese patent application No. 08-296465 filed in the Japanese Patent Office on Nov. 8, 1996, the entire contents of which are hereby incorporated by reference.

What is claimed is:

1. A semiconductor chip device comprising:
   (a) a printed circuit board having a surface on which a wiring pattern and a pad are disposed; and
   (b) a semiconductor chip mounting board, having a first surface on which a semiconductor chip is mounted and a second surface facing said surface of said printed circuit board, including
      (i) a connecting pad formed on said second surface of the mounting board with a solder bump electrically connecting the connecting pad and the wiring pattern, and
      (ii) a connection reinforcing pad thicker than the connecting pad, disposed on said second surface of the mounting board and bearing a solder bump connecting the connection reinforcing pad to said pad disposed on said surface of said printed circuit board.

2. A semiconductor device as defined in claim 1, wherein said wiring pattern and said pad disposed on said surface of said printed circuit board are substantially equal in thickness.

3. A semiconductor device as defined in claim 2, wherein said second surface of the mounting board is rectangular and said connection reinforcing pad is arranged at least in two diagonally positioned corners of said second surface of the mounting board.

4. A semiconductor device as defined in claim 2, wherein a surface of the connection reinforcing pad facing said pad disposed on said surface of the printed circuit board is larger than a surface of the connecting pad facing the wiring pattern.

5. A semiconductor device as defined in claim 2, wherein the solder bump electrically connecting the connecting pad and the wiring pattern has a hand drum shape with a dent in the middle.

* * * * *